(12) United States Patent
Kim et al.

(10) Patent No.: US 10,199,551 B2
(45) Date of Patent: Feb. 5, 2019

(54) SEMICONDUCTOR LIGHT-EMITTING DEVICE

(71) Applicant: SAMSUNG ELECTRONICS CO., LTD., Suwon-si, Gyeonggi-do (KR)

(72) Inventors: Taehun Kim, Bucheon-si (KR); Jae-Yoon Kim, Yongin-si (KR); Youngkyu Sung, Hwaseong-si (KR); Gamham Yong, Hwaseong-si (KR); Dongyeoul Lee, Suwon-si (KR); Suyeol Lee, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/636,084

(22) Filed: Jun. 28, 2017

(65) Prior Publication Data

US 2018/0166618 A1 Jun. 14, 2018

(30) Foreign Application Priority Data

Dec. 8, 2016 (KR) ........................ 10-2016-0166899

(51) Int. Cl.
*H01L 33/00* (2010.01)
*H01L 33/62* (2010.01)
(Continued)

(52) U.S. Cl.
CPC .............. *H01L 33/62* (2013.01); *H01L 24/04* (2013.01); *H01L 24/13* (2013.01); *H01L 33/46* (2013.01); *H01L 2224/0401* (2013.01); *H01L 2224/10126* (2013.01); *H01L 2224/13006* (2013.01); *H01L 2224/13082* (2013.01);
(Continued)

(58) Field of Classification Search
CPC ................................. H01L 33/62; H01L 33/46
See application file for complete search history.

(56) References Cited

U.S. PATENT DOCUMENTS 6,492,198 B2 12/2002 Hwang
6,501,185 B1 12/2002 Chow et al.
(Continued)

FOREIGN PATENT DOCUMENTS

JP 0555228 3/1993
JP 2012023181 2/2012
(Continued)

*Primary Examiner* — William Harriston
(74) *Attorney, Agent, or Firm* — F. Chau & Associates, LLC

(57) ABSTRACT

A semiconductor light-emitting device includes a light-emitting structure including a first semiconductor layer, an active layer and a second semiconductor layer sequentially stacked. A connection electrode is positioned above the light-emitting structure. The connection electrode includes a connection metal layer electrically connected to at least one of the first and second semiconductor layers. A UBM pattern is on the connection electrode. A connection terminal is on the UBM pattern. The connection metal layer includes a first metal element. A heat conductivity of the first metal element is higher than that of gold (Au). The connection terminal includes a second metal element. A first reactivity of the first metal element with the second metal element is lower than a second reactivity of gold (Au) with the second metal element.

19 Claims, 19 Drawing Sheets

(51) Int. Cl.
*H01L 33/46* (2010.01)
*H01L 23/00* (2006.01)

(52) U.S. Cl.
CPC ............... *H01L 2224/13111* (2013.01); *H01L 2924/014* (2013.01); *H01L 2924/0132* (2013.01); *H01L 2924/0133* (2013.01); *H01L 2924/12041* (2013.01)

(56) References Cited

U.S. PATENT DOCUMENTS

| | | |
|---|---|---|
| 6,621,164 B2 | 9/2003 | Hwang et al. |
| 9,082,776 B2 | 7/2015 | Lu et al. |
| 9,583,687 B2 | 2/2017 | Hwang |
| 2012/0248605 A1 | 10/2012 | Yamaguchi |
| 2016/0133807 A1* | 5/2016 | Hwang ................... H01L 33/62 257/76 |

FOREIGN PATENT DOCUMENTS

| | | |
|---|---|---|
| KR | 100313706 | 10/2001 |
| KR | 1020160056330 | 5/2016 |

* cited by examiner ly stacked. A connection electrode is positioned above the light-emitting structure. The connection electrode includes a connection metal layer electrically connected to at least one of the first and second semiconductor layers. A UBM pattern is on the connection electrode. A connection terminal is on the UBM pattern. The connection metal layer includes a first metal element. A heat conductivity of the first metal element is higher than that of gold (Au). The connection terminal includes a second metal element. A first reactivity of the first metal element with the second metal element is lower than a second reactivity of gold (Au) with the second metal element.

According to an exemplary embodiment of the present inventive concept, a semiconductor light-emitting device includes a light-emitting structure including a first semiconductor layer, an active layer and a second semiconductor layer sequentially stacked. A connection electrode is on the light-emitting structure. A UBM pattern is on the connection electrode. A protective insulating layer is disposed on the connection electrode and is spaced apart from the UBM pattern along an upper surface of the connection electrode. A connection terminal is disposed on the UBM pattern. The connection terminal is in contact with the connection electrode. The connection electrode includes a connection metal layer electrically connected to at least one of the first and second semiconductor layers. A barrier layer is disposed between the connection metal layer and the UBM pattern and extends between the UBM pattern and the protective insulating layer.

According to an exemplary embodiment of the present inventive concept, a semiconductor light-emitting device includes a light-emitting structure including a first semiconductor layer, an active layer and a second semiconductor layer sequentially stacked. A connection metal layer is positioned above the light-emitting structure and is electrically connected to at least one of the first and second semiconductor layers. A UBM pattern is on the connection metal layer. A protective insulating layer is positioned on the connection metal layer and includes an opening partially exposing a top surface of the UBM pattern. A connection terminal is disposed on the top surface of the UBM pattern exposed through the opening. The connection metal layer includes a first metal element of which a heat conductivity is higher than that of gold (Au). The connection terminal includes a second metal element. A first reactivity of the first metal element with the second metal element is lower than a second reactivity of gold (Au) with the second metal element.

BRIEF DESCRIPTION OF THE DRAWINGS

The above and other features of the inventive concept will become more apparent by describing in detail exemplary embodiments thereof, with reference to the accompanying drawings, in which.

DETAILED DESCRIPTION OF THE EMBODIMENTS

Figure 1:
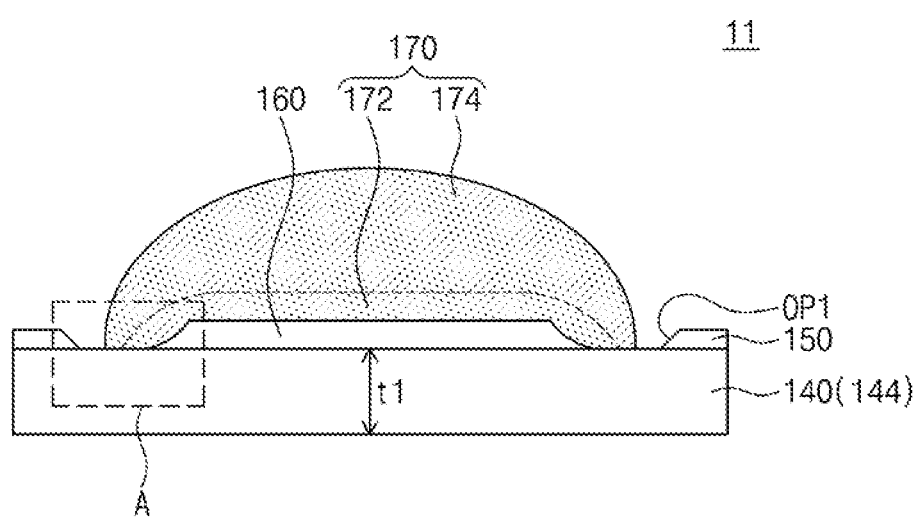
FIG. 1 is a schematic cross-sectional view illustrating an electrical connection part of a semiconductor light-emitting device according to an exemplary embodiment of the present inventive concept.

Exemplary embodiments of the present inventive concept will be described below in more detail with reference to the accompanying drawings. In this regard, the present inventive concept may have different forms and should not be construed as being limited to the exemplary embodiments of the present inventive concept described herein. Like reference numerals may refer to like elements throughout the specification and drawings.

It will be understood that the spatially relative terms may encompass different orientations of the device in use or operation in addition to the orientation described in the specification and drawings.

A semiconductor light-emitting device according to an exemplary embodiment of the present inventive concept may include a light-emitting structure and a plurality of electrical connection parts disposed on the light-emitting structure. The electrical connection parts may electrically connect the light-emitting structure to an external circuit. The electrical connection part of the semiconductor light-emitting device according to an exemplary embodiment of the present inventive concept will be described hereinafter with reference to the drawings.

FIG. 1 is a schematic cross-sectional view illustrating an electrical connection part of a semiconductor light-emitting device according to an exemplary embodiment of the present inventive concept. FIGS. 2A, 2B, 2C, and 2D are each enlarged views corresponding to a portion 'A' of FIG. 1.

Referring to FIG. 1, an electrical connection part 11 of a semiconductor light-emitting device according to an exemplary embodiment of the present inventive concept may include a connection electrode 140, an under-bump metal (UBM) pattern 160 (which may be referred to herein as 'a UBM pattern 160'), and a connection terminal 170. In an exemplary embodiment of the present inventive concept, the connection terminal 170 may include an inter-metal compound 172 and a solder bump 174.

Figure 13:
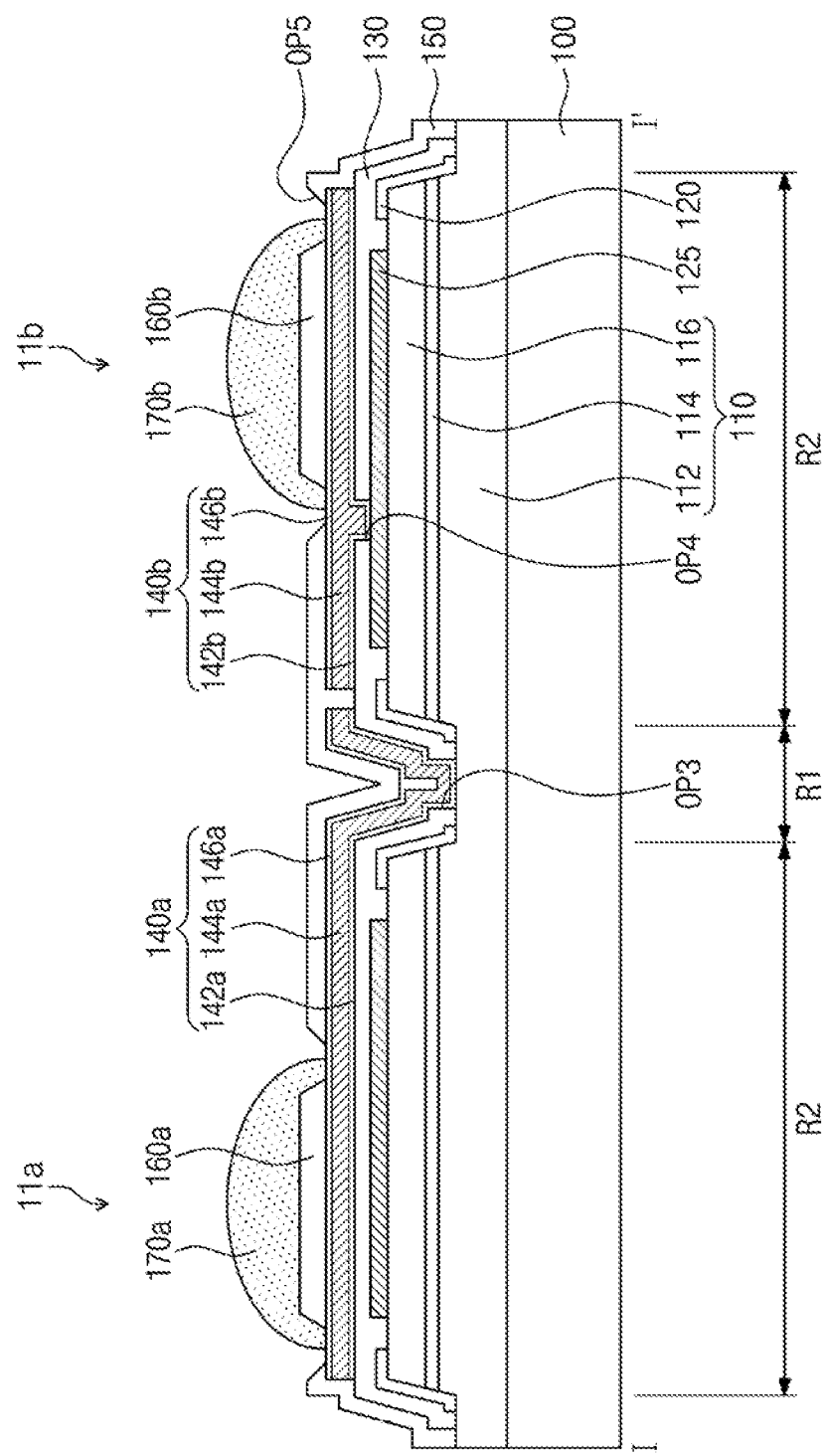
FIGS. 13 to 16 are cross-sectional views taken along a line I-I' of FIG. 12.
Figure 14:
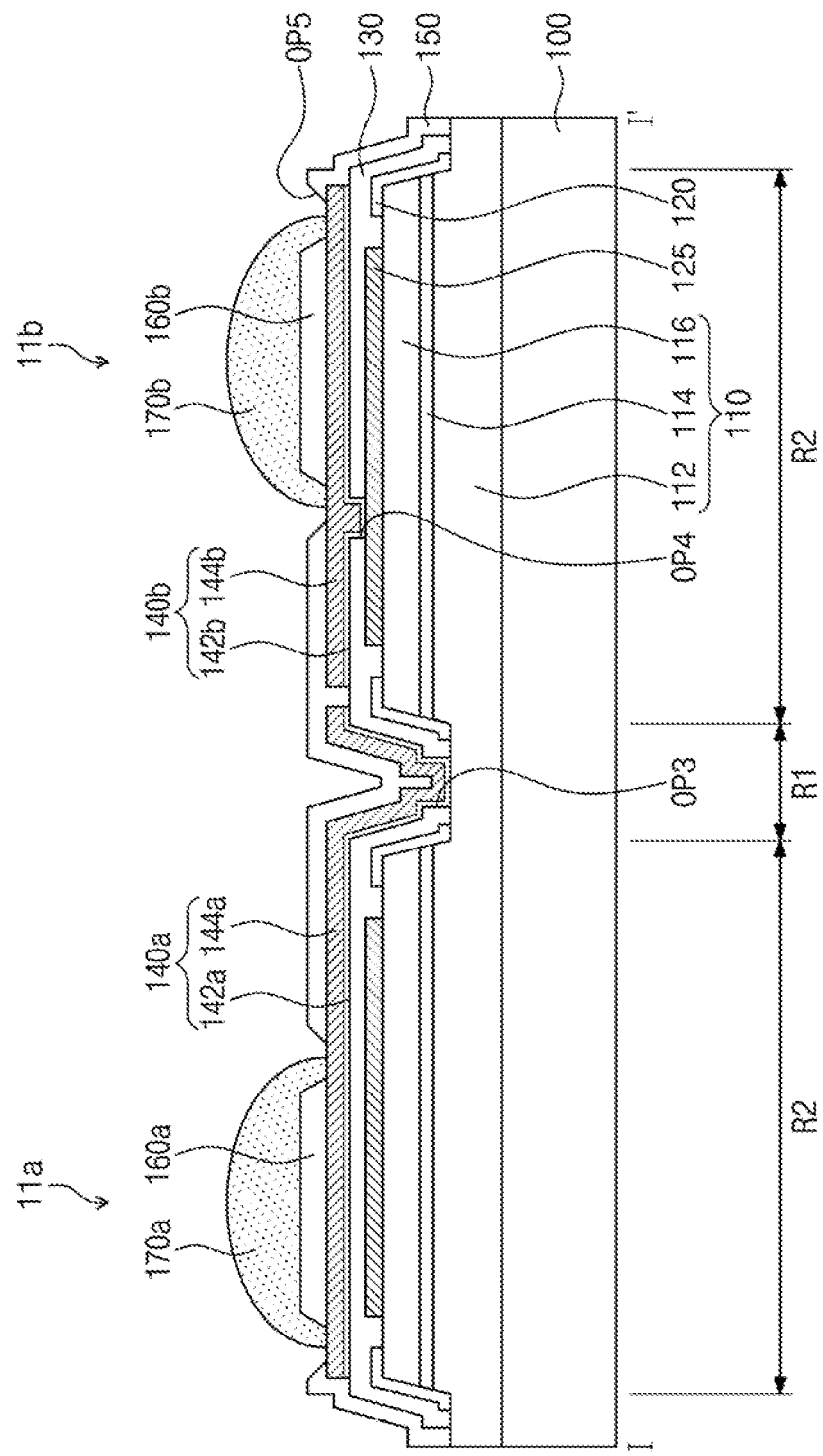
Figure 15:
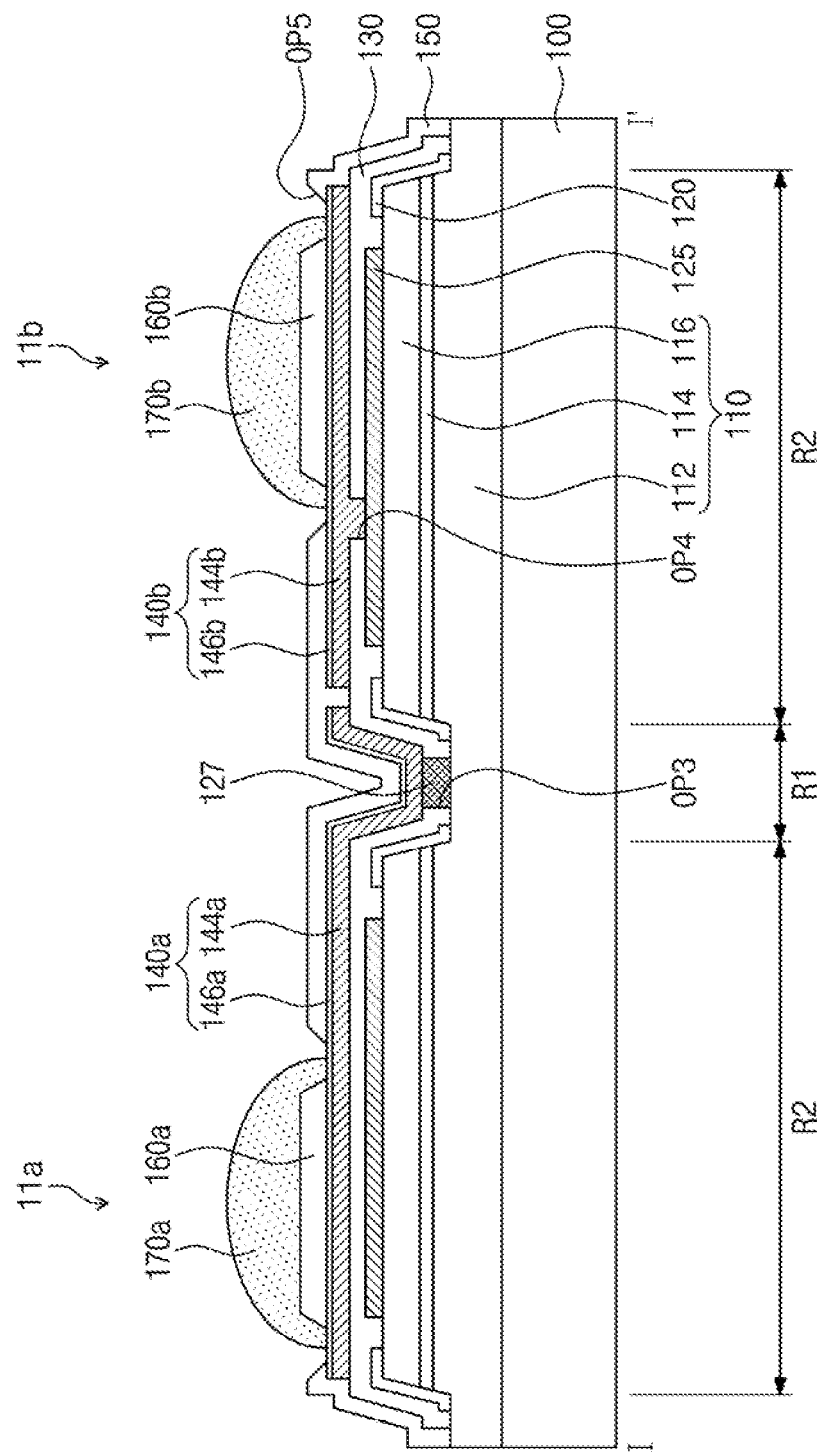
Figure 16:
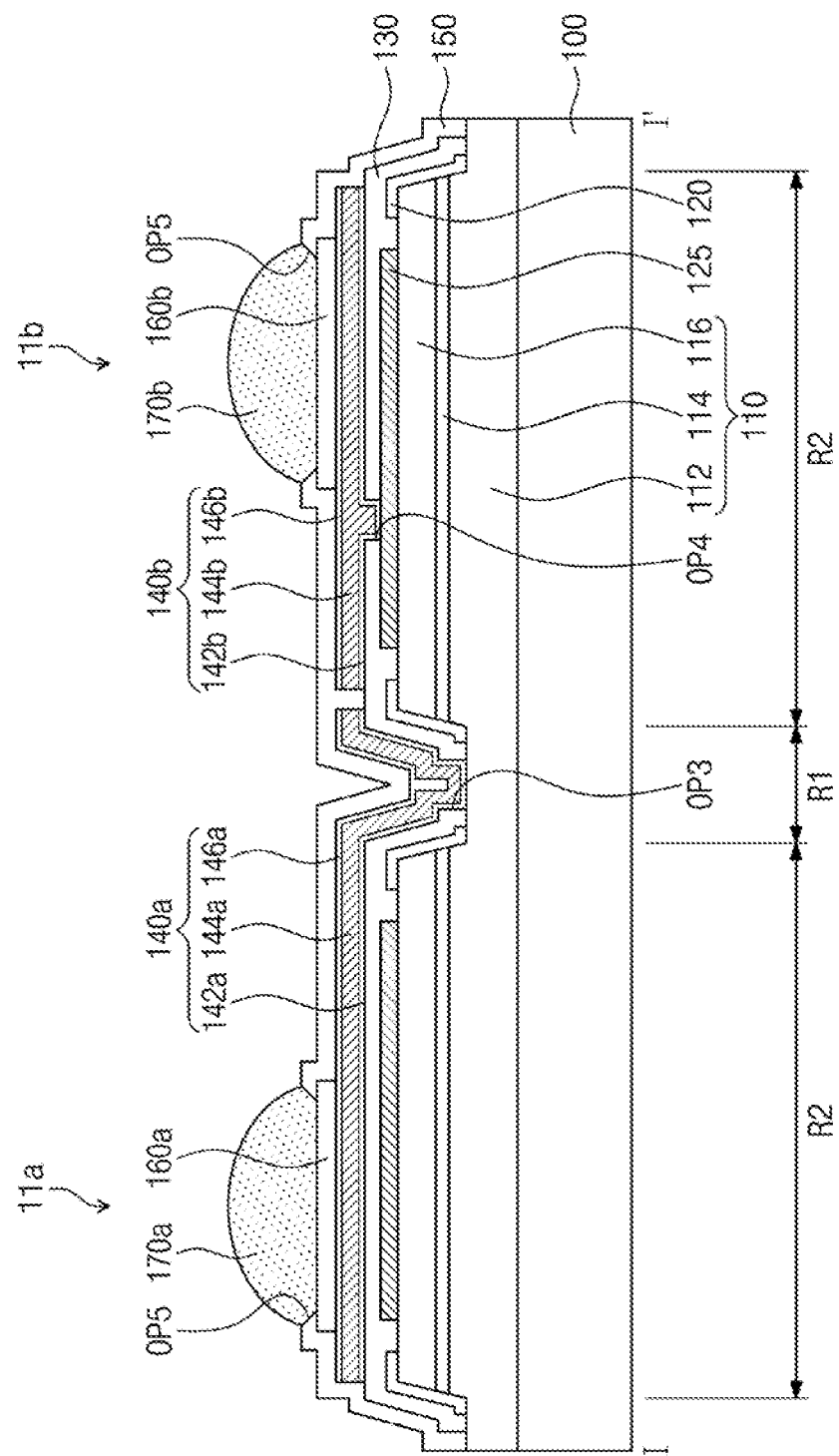

The connection electrode 140 may be electrically connected to at least one semiconductor layer (e.g., a first semiconductor layer 112 or a second semiconductor layer 116—see, e.g., FIG. 13) of the light-emitting structure (e.g., light emitting structure 110—see, e.g., FIG. 13). A connection structure of the connection electrode 140 and the semiconductor layers will be described in more detail below. According to an exemplary embodiment of the present inventive concept, the connection electrode 140 may include a metal layer having a single layered structure or a multiple layer structure. In an exemplary embodiment of the present inventive concept, the connection electrode 140 may include a single connection metal layer 144. The connection metal layer 144 may include a metal material that functions as a heat dissipation layer for dissipating heat generated from the light-emitting structure to the outside and functions as an electrical interconnection line for connecting the semiconductor layers to the external circuit. As an example, the connection metal layer 144 may include a metal material having a relatively high heat conductivity and a relatively low resistance. In an exemplary embodiment of the present inventive concept, the connection metal layer 144 may include a metal material that has a relatively low reactivity with ingredient material included in the connection terminal 170 at a relatively high temperature.

As an example, the connection metal layer 144 may include a first metal element M1 that has a higher heat conductivity than gold (Au). In addition, a first reactivity (e.g., a reaction rate) of the first metal element M1 with a second metal element M2 included in the connection terminal 170 may be lower than a second reactivity (e.g., a reaction rate) of gold (Au) with the second metal element M2. For example, the first metal element M1 may include copper (Cu), and the second metal element M2 may include tin (Sn). Copper (Cu) may have a higher heat conductivity than gold (Au), and a first reactivity (e.g., a reaction rate) of copper (Cu) with tin (Sn) may be lower than a second reactivity (e.g., a reaction rate) of gold (Au) with tin (Sn).

The connection metal layer 144 may have a first thickness t1. The first thickness t1 of the connection metal layer 144 may range from about 500 Å to about 15,000 Å. The thickness t1 may be varied in consideration of the heat dissipation and/or resistance characteristics of the connection metal layer 144. As an example, the first thickness t1 of the connection metal layer 144 may be about 5,000 Å or more. As an example, a total planar area of the connection metal layer 144 may be greater than a total planar area of the UBM pattern 160 when viewed in a plan view (see, e.g., FIG. 12). For example, the total planar area of the connection metal layer 144 may be equal to or greater than twice the total planar area of the UBM pattern 160. The total planar area of the connection metal layer 144 may be equal to or greater than about 80% of a total planar area of the semiconductor light-emitting device.

A protective insulating layer 150 may be disposed on the connection electrode 140. The protective insulating layer 150 may include a first opening OP1 that partially exposes a top surface of the connection electrode 140. For example, the protective insulating layer 150 may include a silicon oxide layer and/or a silicon nitride layer, which correspond to passivation insulating layers.

The UBM pattern 160 may be disposed on the top surface of the connection electrode 140, which is exposed by the first opening OP1. In an exemplary embodiment of the present inventive concept, the UBM pattern 160 may be in direct contact with the top surface of the connection electrode 140 (e.g., the connection metal layer 144) but may be spaced apart from the protective insulating layer 150 along an upper surface of the connection electrode 140. As an example, the UBM pattern 160 may have sidewalls spaced apart from a sidewall of the first opening OP1. Thus, the connection metal layer 144 between the protective insulating layer 150 and the UBM pattern 160 may be exposed. As an example, a top surface of the UBM pattern 160 may be substantially flat. The sidewalls of the UBM pattern 160 may be inclined with respect to the top surface of the UBM pattern 160 toward the connection electrode 140. The sidewalls of the UBM pattern 160 may have, for example, a concave slope. The UBM pattern 160 may increase an interface bonding strength between the connection electrode 140 and the solder bump 174 and may provide an electrical path. In addition, the UBM pattern 160 may prevent solder from being diffused into the connection electrode 140 in a reflow process. For example, the UBM pattern 160 may include at least one of Ni, Cu, Cr, Au, $NiO_x$, $CrO_x$, Ti, $TiO_x$, Sn, $SnO_x$, or TiW.

The UBM pattern 160 may include a metal layer having a single layer structure or a multi-layer structure. In an exemplary embodiment of the present inventive concept, referring to FIG. 2A, the UBM pattern 160 may include a first sub-UBM pattern 162 and a second sub-UBM pattern 164, which are sequentially stacked. The first and second sub-UBM patterns 162 and 164 may each include metal materials different from each other. For example, the first sub-UBM pattern 162 may include Ti, Cr, or Cu, and the second sub-UBM pattern 164 may include Ni. The first sub-UBM pattern 162 may function as a glue or adhesive layer or a barrier layer, the second sub-UBM pattern 164 may function as a wetting layer. In an exemplary embodiment of the present inventive concept, referring to FIG. 2B, the UBM pattern 160 may include the first sub-UBM pattern 162, the second sub-UBM pattern 164 and a third sub-UBM pattern 166, which are sequentially stacked. In this case, the first to third sub-UBM patterns 162, 164, and 166 may each include metal materials different from each other. For example, the first to third sub-UBM patterns 162, 164, and 166 may include Ti, Cu, and Ni, respectively. The above mentioned structures of the UBM pattern 160 are available to exemplary embodiments of the present inventive concept described in more detail below.

The solder bump 174 may be disposed on the UBM pattern 160, and the inter-metal compound 172 may be positioned between the UBM pattern 160 and the solder bump 174. As an example, the solder bump 174 may be bonded to the UBM pattern 160 through the inter-metal compound 172. The solder bump 174 may be firmly bonded to the UBM pattern 160 by the inter-metal compound 172 acting as an adhesive.

The solder bump 174 may be formed by performing a reflow process on solder lying on the UBM pattern 160, and the inter-metal compound 172 may be formed in the reflow process for forming the solder bump 174. The solder may include the second metal element M2 (e.g., Sn) or a compound including the second metal element M2. For example, the solder may include Sn, Sn—Pb, Sn—In, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, Sn—Ag—Ce, or any combination thereof. A metal included in the solder may react with a metal included in the UBM pattern 160 to form the inter-metal compound 172. For example, the inter-metal compound 172 may include a 2-element alloy of tin-nickel formed by reacting tin (Sn) of the solder with nickel (Ni) of the UBM pattern 160.

Figure 2A:
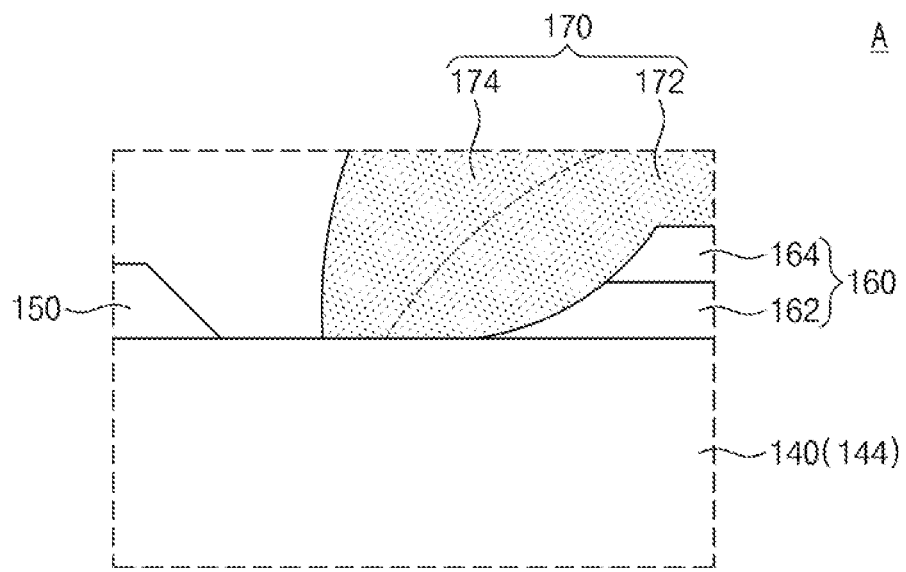
FIGS. 2A, 2B, 2C, and 2D are each enlarged views corresponding to a portion 'A' of FIG. 1.
Figure 2B:
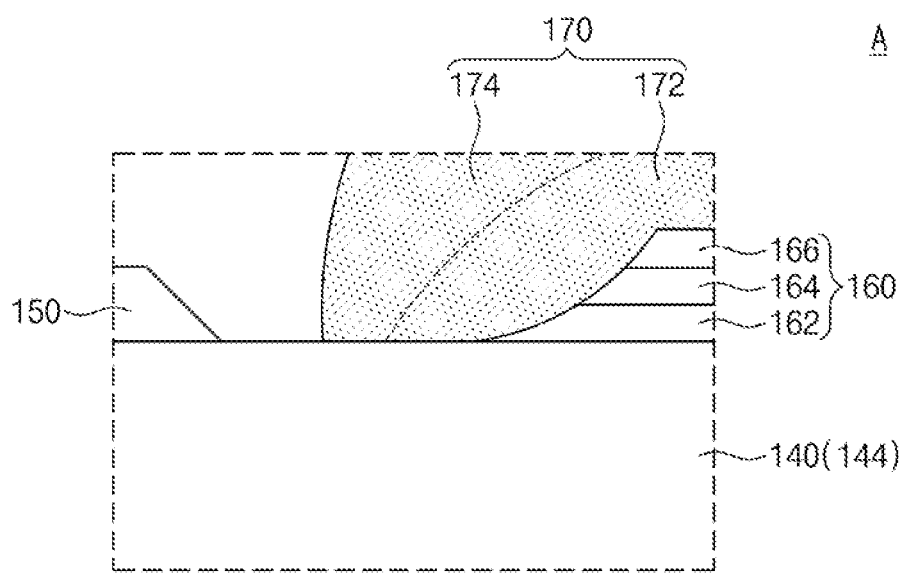
Figure 2C:
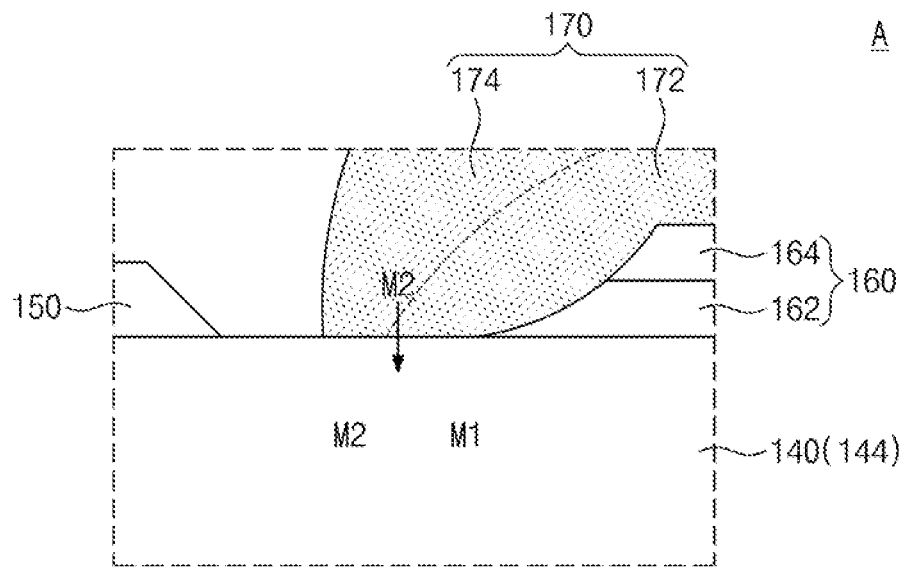
Figure 2D:
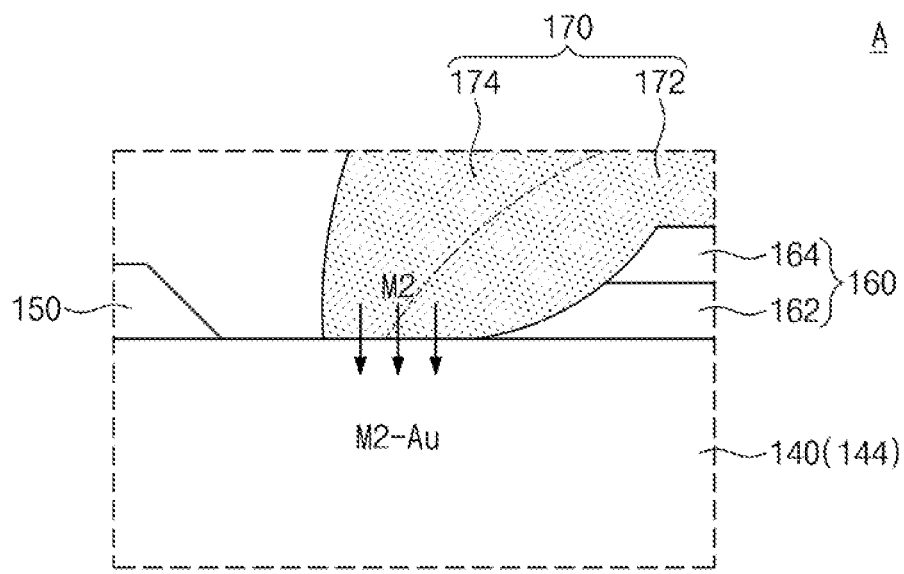

In the reflow process, the inter-metal compound 172 formed between the solder bump 174 and the UBM pattern 160 by phase change of the solder may extend onto the sidewall of the UBM pattern 160 by wettability of the UBM pattern 160. Thus, the connection terminal 170 may extend into a space between the protective insulating layer 150 and the UBM pattern 160 to come into contact with the connection metal layer 144. Thus, referring, for example, the FIG. 2C, the second metal element M2 (e.g., tin) in the connection terminal 170 may be diffused into the connection metal layer 144 through a contact area of the connection terminal 170 and the connection metal layer 144. Referring to FIG. 2C, for example, the connection terminal 170 may be spaced apart from the protective insulating layer 150. However, exemplary embodiments of the present inventive concept are not limited thereto. In an exemplary embodiment of the present inventive concept, the connection terminal 170 may come into direct contact with the protective insulating layer 150 adjacent to the UBM pattern 160 in the reflow process.

As an example, the connection metal layer 144 may include gold (Au) having a relatively low resistance characteristic in a structure in which the connection terminal 170 is in contact with the connection metal layer 144. However, gold (Au) may have a relatively high reactivity (e.g., reaction rate) with the second metal element M2 (e.g., tin (Sn)) included in the connection terminal 170. Thus, referring to FIG. 2D, the amount of the second metal element M2 (e.g., tin) diffused into the connection metal layer 144 may be increased in the reflow process, and a volume of the connection metal layer 144 may be expanded by reaction of gold and the second metal element M2 (e.g., tin) diffused into the connection metal layer 144. The volume expansion of the connection metal layer 144 may cause cracks in the connection metal layer 144 and other layers (e.g., the inter-metal compound 172 and/or an insulating layer under the connection metal layer 144) adjacent to the connection metal layer 144, and thus the solder bump 174 may come apart from the device or a metal material (e.g., silver) of the connection terminal 170 may move into other layers through the cracks, which may cause an electrical short. According to an exemplary embodiment of the present inventive concept, the connection metal layer 144 may include the first metal element M1 (e.g., copper). The first metal element M1 (e.g., copper) may have a relatively lower first reactivity with the second metal element M2 (e.g., tin) than a second reactivity of gold (Au) with the second metal element M2, thus inhibiting reaction of the first metal element M1 and the second metal element M2 diffused into the connection metal layer 144. Thus, the occurrence of cracks of the connection metal layer 144 and/or the other layers adjacent thereto may be reduce or prevented, thus increasing the reliability of the semiconductor light-emitting device according to an exemplary embodiment of the present inventive concept.

Figure 3:
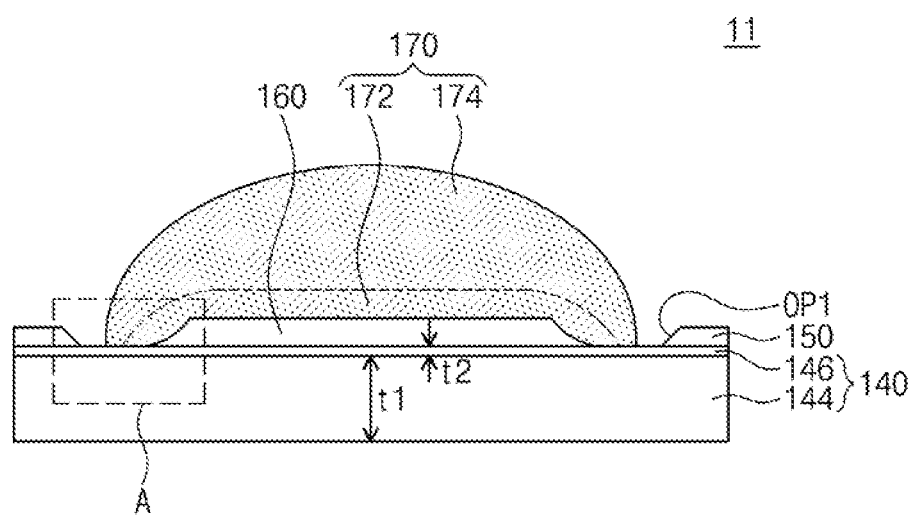
FIGS. 3, 5, and 6 are each schematic cross-sectional views illustrating electrical connection parts of semiconductor light-emitting devices according to an exemplary embodiment of the present inventive concept.
Figure 4A:
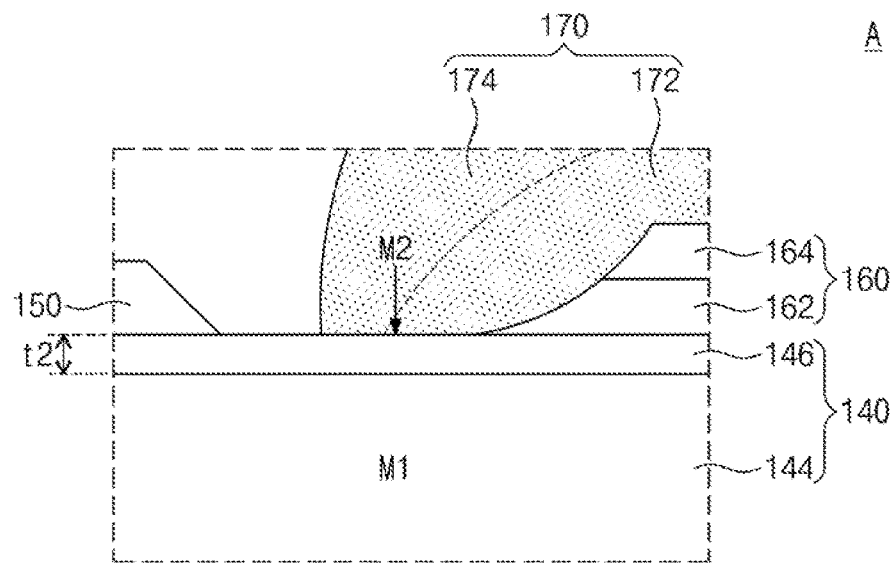
FIGS. 4A, 4B, and 4C are each enlarged views corresponding to a portion 'A' of FIG. 3.
Figure 4B:
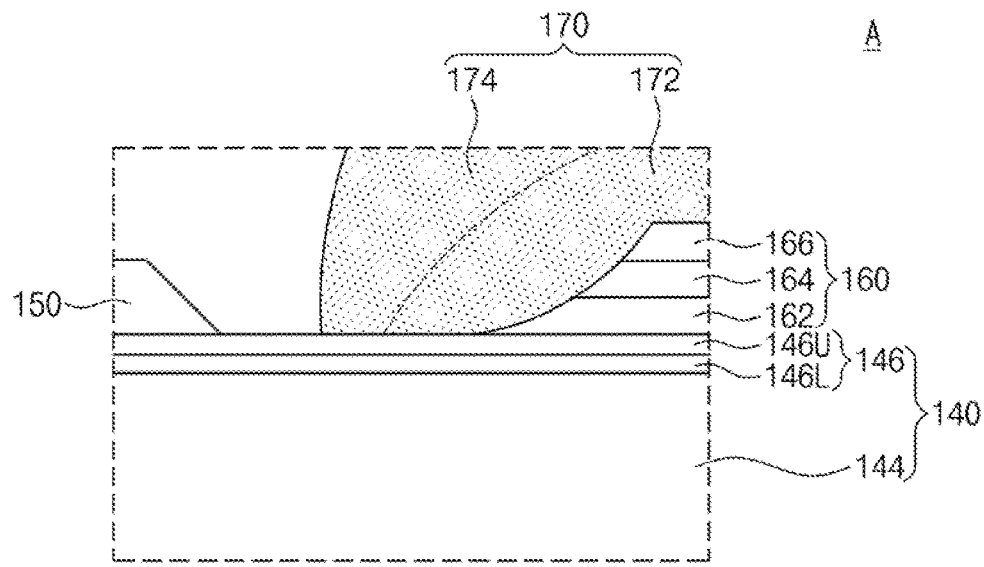
Figure 4C:
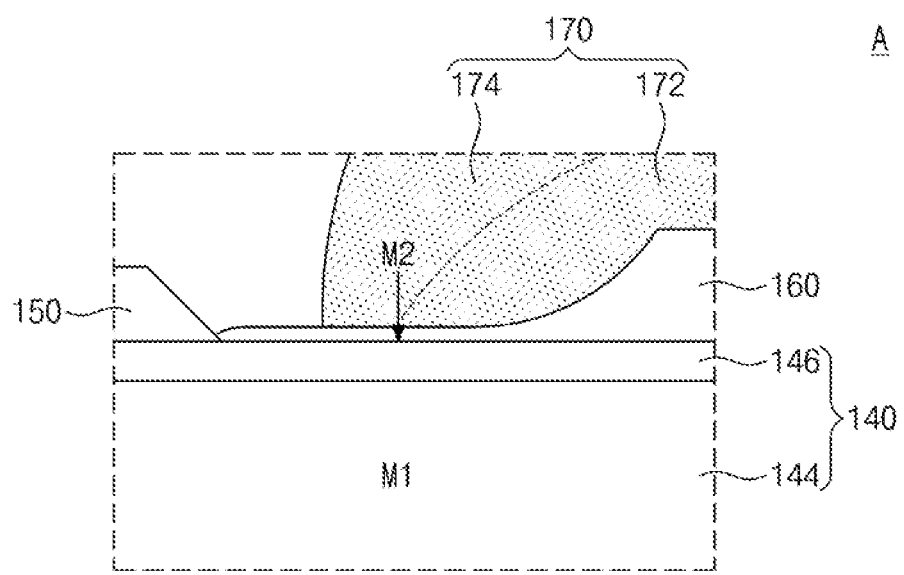
Figure 5:
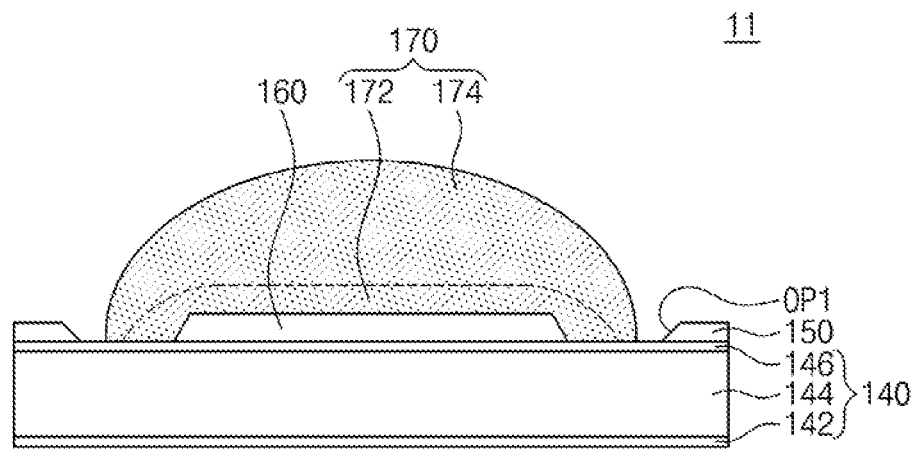
Figure 6:
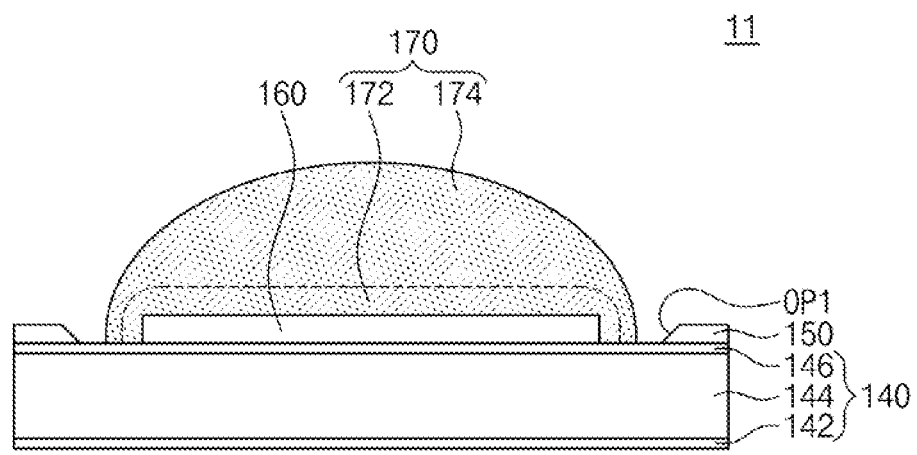

FIGS. 3, 5, and 6 are each schematic cross-sectional views illustrating electrical connection parts of semiconductor light-emitting devices according to an exemplary embodiment of the present inventive concept. FIGS. 4A, 4B, and 4C are each enlarged views corresponding to a portion 'A' of FIG. 3.

Each of electrical connection parts 11 described with reference to FIGS. 3 and 5 may include the connection electrode 140 having a multi-layered metal structure including the connection metal layer 144. Other features of the electrical connection parts 11 described with reference to FIGS. 3 and 5 may be substantially the same as corresponding features of the electrical connection part 11 described above with reference to FIG. 1, and thus duplicative descriptions may be omitted below.

Referring to FIG. 3, the connection electrode 140 may include the connection metal layer 144 and a barrier layer 146 disposed on the connection metal layer 144. The barrier layer 146 may substantially cover a top surface of the connection metal layer 144. For example, the barrier layer 146 may be disposed between the connection metal layer 144 and the UBM pattern 160 and may extend between the connection metal layer 144 and the protective insulating layer 150. Thus, the barrier layer 146 may substantially cover the top surface of the connection metal layer 144 exposed between the UBM pattern 160 and the protective insulating layer 150. As an example, the barrier layer 146 may be disposed between the connection terminal 170 and the connection metal layer 144, and the connection terminal 170 need not be in direct contact with the connection metal layer 144. Referring to FIG. 4A, the barrier layer 146 may prevent the second metal element M2 of the connection terminal 170 from being diffused into the connection metal layer 144.

The barrier layer 146 may include a metal material that prevents the second metal element M2 from being diffused into the connection metal layer 144 and electrically connects the UBM pattern 160 to the connection metal layer 144. For example, the barrier layer 146 may include Cr, Ti, Pt, TiW, or any alloy including at least one thereof. According to an exemplary embodiment of the present inventive concept, the barrier layer 146 may have a single-layered or multi-layered structure. In an exemplary embodiment of the present inventive concept, the barrier layer 146 may be a single layer (see, e.g., FIG. 4A). In this case, the barrier layer 146 may include, but is not limited to, chromium (Cr). In an exemplary embodiment of the present inventive concept, referring to FIG. 4B, the barrier layer 146 may include a first barrier layer 146L and a second barrier layer 146U, which are sequentially stacked. In this case, the first barrier layer 146L may include Cr, and the second barrier layer 146U may include Ti, Pt, or TiW. However, exemplary embodiments of the present inventive concept are not limited thereto. For example, the barrier layer 146 may include three or more layers.

The barrier layer 146 may have a second thickness t2. The second thickness t2 of the barrier layer 146 may be smaller than the first thickness t1 of the connection metal layer 144, which may minimize an influence on the heat dissipation and resistance characteristics of the connection electrode 140. For example, the second thickness t2 of the barrier layer 146 may range from about 300 Å to about 10,000 Å.

Referring to FIG. 4A, the UBM pattern 160 may include the first sub-UBM pattern 162 and the second sub-UBM pattern 164, which are sequentially stacked. However, exemplary embodiments of the present inventive concept are not limited thereto. In an exemplary embodiment of the present inventive concept, the UBM pattern 160 may include a single layer or three or more layers. Other features or components of the electrical connection part 11 described with reference to FIG. 3 may be the same as described with reference to FIG. 1, and thus duplicative descriptions may be omitted below.

According to an exemplary embodiment of the present inventive concept, the connection electrode 140 may include the barrier layer 146, which may prevent the diffusion of the second metal element M2 of the connection terminal 170, and thus it is possible to prevent a defect (e.g., the crack caused by the volume expansion of the connection metal layer 144) which may occur in the process of forming the connection terminal 170. Thus, the reliability of the semiconductor light-emitting device may be further increased.

In an exemplary embodiment of the present inventive concept, the UBM pattern 160 may laterally extend along an upper surface of the connection electrode 140 to be in contact with the protective insulating layer 150 (see, e.g., FIG. 4C). Thus, the connection terminal 170 need not be in contact with the connection electrode 140. However, since a thickness of the UBM pattern 160 between the connection terminal 170 and the connection electrode 140 is relatively small, the second metal element M2 may permeate into the connection electrode 140 through the UBM pattern 160. Even in this case, since the connection electrode 140 includes the barrier layer 146, it is possible to further prevent the defect (e.g., the crack caused by the volume expansion of the connection metal layer 144) which may occur in the process of forming the connection terminal 170. In an exemplary embodiment of the present inventive concept, the barrier layer 146 may be omitted in the connection electrode 140 described with reference to FIG. 4C.

Referring to FIG. 5, the connection electrode 140 may further include a reflective metal layer 142 that is positioned under the connection metal layer 144. As an example, the connection electrode 140 may include the reflective metal layer 142, the connection metal layer 144 and the barrier layer 146, which are sequentially stacked. The connection metal layer 144 and the barrier layer 146 may be the same as described above, and thus duplicative descriptions may be omitted below. The reflective metal layer 142 may include a metal or alloy of which a reflectivity is relatively high in a wavelength band of light emitted from the light-emitting structure. Thus, a reflection efficiency of the light-emitting structure may be increased to increase a light extraction efficiency of the semiconductor light-emitting device. For example, the reflective metal layer 142 may include Ag, Al, Cr, Ni, Au, Ti, any combination thereof, or any alloy thereof. In an exemplary embodiment of the present inventive concept, the barrier layer 146 may be omitted in the connection electrode 140 described with reference to FIG. 5. As an example, the connection electrode 140 may include the reflective metal layer 142 and the connection metal layer 144, which are sequentially stacked.

Referring to FIG. 6, the UBM pattern 160 may have a sidewall that is substantially perpendicular to the top surface of the connection electrode 140. Other features or components of the electrical connection part 11 described with reference to FIG. 6 may be the same as described above, and thus duplicative descriptions may be omitted. In an exemplary embodiment of the present inventive concept, the connection electrode 140 may include the reflective metal layer 142, the connection metal layer 144 and the barrier layer 146, which are sequentially stacked. However, exemplary embodiments of the present inventive concept are not limited thereto. In an exemplary embodiment of the present inventive concept, at least one of the reflective metal layer 142 and the barrier layer 146 may be omitted in the connection electrode 140 described with reference to FIG. 6.

Figure 7:
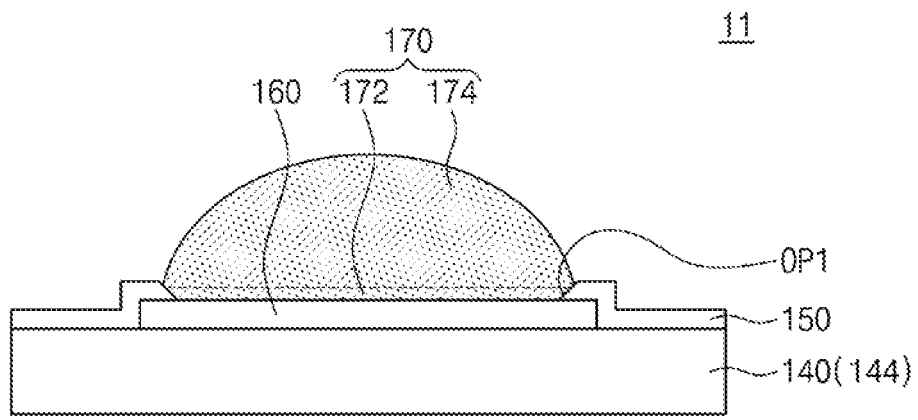
FIGS. 7 and 8 are each schematic cross-sectional views illustrating electrical connection parts of semiconductor light-emitting devices according to an exemplary embodiment of the present inventive concept.
Figure 8:
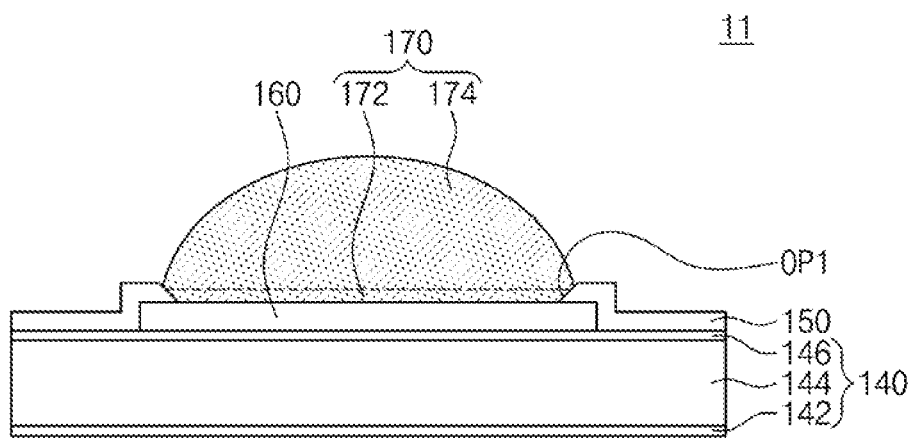

FIGS. 7 and 8 are each schematic cross-sectional views illustrating electrical connection parts of semiconductor light-emitting devices according to an exemplary embodiment of the present inventive concept. Descriptions of the same features or components as those described above may be omitted below.

Referring to FIGS. 7 and 8, the protective insulating layer 150 may be in contact with the UBM pattern 160. For example, the protective insulating layer 150 may substantially cover the sidewall of the UBM pattern 160 and may extend onto the top surface of the UBM pattern 160. The first opening OP1 of the protective insulating layer 150 may partially expose the top surface of the UBM pattern 160. The connection terminal 170 may be disposed on the top surface of the UBM pattern 160 exposed by the first opening OP1. Since the protective insulating layer 150 is in contact with the UBM pattern 160, the electrical connection part 11 may have a structure in which the connection terminal 170 is not in contact with the connection electrode 140. For example, the connection terminal 170 may be in contact with the protective insulating layer 150 but may be spaced apart from the connection electrode 140. Thus, it is possible to further prevent the defect (e.g., the crack caused by the volume expansion of the connection metal layer 144) which may occur in the process of forming the connection terminal 170. Thus, the reliability of the semiconductor light-emitting device may be further increased.

The connection electrode 140 may include a single connection metal layer 144 (see, e.g., FIG. 7). Alternatively, the connection electrode 140 may include a metal layer having a multi-layered structure including the connection metal layer 144 (see, e.g., FIG. 8). In an exemplary embodiment of the present inventive concept, one of the reflective metal layer 142 and the barrier layer 146 may be omitted in the connection electrode 140 described with reference to FIG. 8.

A method of forming an electrical connection part according to an exemplary embodiment of the present inventive concept will be described below in more detail.

FIGS. 9A to 9E are cross-sectional views illustrating a method of forming an electrical connection part of a semiconductor light-emitting device according to an exemplary embodiment of the present inventive concept. The descriptions to the same features or components as those described above may be omitted below.

Figure 9A:
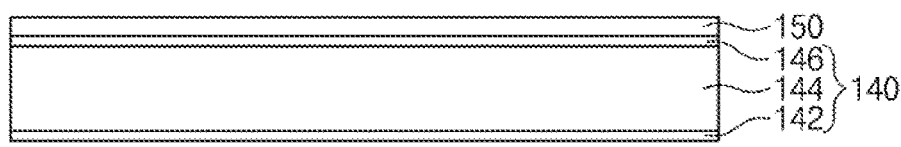
FIGS. 9A to 9E are cross-sectional views illustrating a method of forming an electrical connection part of a semiconductor light-emitting device according to an exemplary embodiment of the present inventive concept.

Referring to FIG. 9A, the connection electrode 140 and the protective insulating layer 150 may be formed on a substrate. In an exemplary embodiment of the present inventive concept, the connection electrode 140 may include the reflective metal layer 142, the connection metal layer 144 and the barrier layer 146, which are sequentially stacked. Each of the reflective metal layer 142, the connection metal layer 144 and the barrier layer 146 may be formed using a sputtering process, an electron-beam (e-beam) deposition process, or a plating process. In an exemplary embodiment of the present inventive concept, at least one of the reflective metal layer 142 or the barrier layer 146 may be omitted in the connection electrode 140. The protective insulating layer 150 may be formed to substantially cover an entire top surface of the connection electrode 140 by a chemical vapor deposition (CVD) process, a sputtering process, or an e-beam deposition process.

Figure 9B:
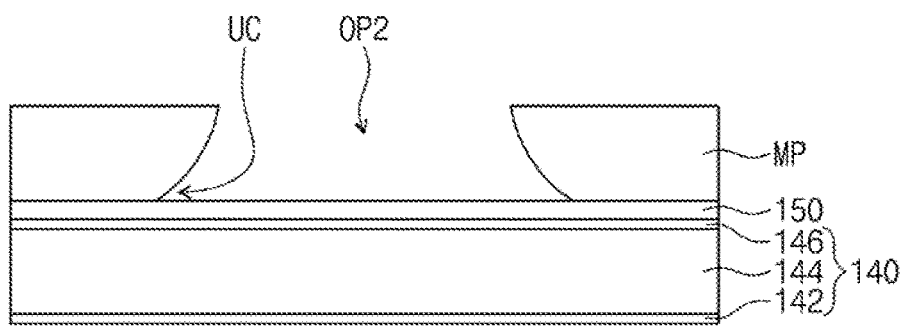

Referring to FIG. 9B, a photoresist pattern MP may be formed on the protective insulating layer 150. The photoresist pattern MP may include a second opening OP2 exposing a portion of the protective insulating layer 150. A lower portion of an inner sidewall of the photoresist pattern MP may be laterally recessed to define an undercut region UC under a portion of the photoresist pattern MP adjacent to the second opening OP2. As an example, the second opening OP2 may have a structure extending into the undercut region UC under the portion of the photoresist pattern MP.

Figure 9C:
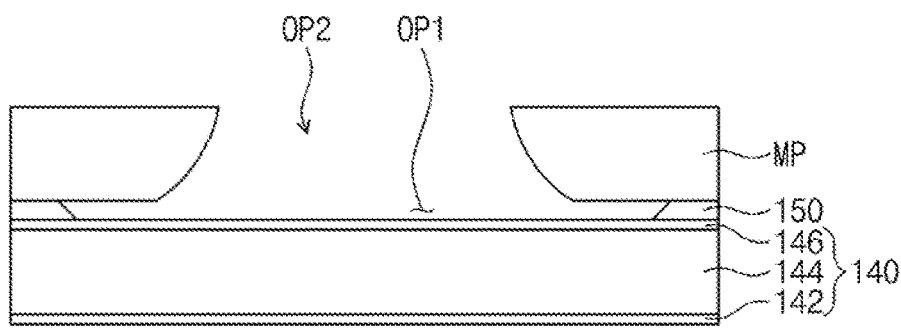

Referring to FIG. 9C, the protective insulating layer 150 exposed by the second opening OP2 may be removed. The removal of the protective insulating layer 150 may be performed using a wet etching process. During the wet etching process, the protective insulating layer 150 may be laterally etched through the undercut region UC of FIG. 9B. Thus, the first opening OP1 may be formed in the protective insulating layer 150. A width of the first opening OP1 may be greater than that of the second opening OP2, and the first opening OP1 may expose the connection electrode 140.

Figure 9D:
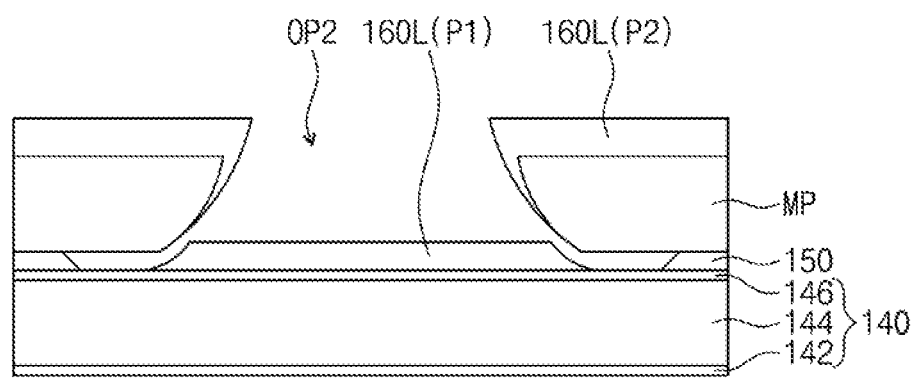

Referring to FIG. 9D, a UBM layer 160L may be formed on the connection electrode 140. For example, the UBM layer 160L may be formed using a sputtering process. The UBM layer 160L may be formed to substantially cover the top surface of the connection electrode 140 exposed through the second opening OP2 and a top surface and the inner sidewall of the photoresist pattern MP. Since the second opening OP2 has the structure extending into the undercut region UC of FIG. 9B, a deposition material may also be deposited on the top surface of the connection electrode 140 under the undercut region UC during the sputtering process. As an example, the UBM layer 160L may include a first portion P1 formed on the connection electrode 140 and a second portion P2 formed on the photoresist pattern MP. The first portion P1 may have a sidewall that extends under the undercut region UC of the photoresist pattern MP and is inclined with respect to the top surface of the connection electrode 140.

Figure 9E:
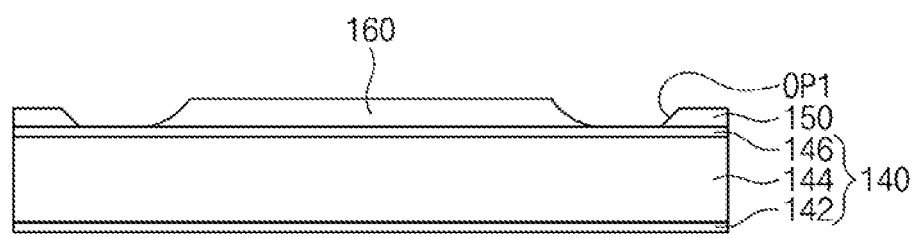

Referring to FIG. 9E, the photoresist pattern MP may be removed. The removal of the photoresist pattern MP may be performed using a lift-off process. The second portion P2 of the UBM layer 160L may also be removed during the removal of the photoresist pattern MP. The first portion P1 of the UBM layer 160L remaining after the removal of the photoresist pattern MP may be defined as the UBM pattern 160.

Referring again to FIG. 5, the solder bump 174 may be formed on the UBM pattern 160. For example, solder may be deposited on the UBM pattern 160, and a reflow process may be performed on the solder to form the solder bump 174. During the reflow process, the inter-metal compound 172 may be formed between the solder bump 174 and the UBM pattern 160. For example, the UBM pattern 160 and the solder (e.g., tin) may be partially melted to form the inter-metal compound 172 (e.g., a 2-element alloy of tin-nickel (SnNi). The inter-metal compound 172 may extend to substantially cover the sidewall of the UBM pattern 160, and thus the connection terminal 170 may extend in a space between the protective insulating layer 150 and the UBM pattern 160 so as to be in contact with the connection electrode 140. In an exemplary embodiment of the present inventive concept, solder formed on a package substrate may be bonded to the UBM pattern 160, and then, the reflow process may be performed to form the solder bump 174. According to an exemplary embodiment of the present inventive concept, the connection metal layer 144 may include a material including the first metal element M1 (e.g., copper (Cu)) and/or the barrier layer 146 may include the connection metal layer 144, and thus it is possible to prevent the defect (e.g., the crack caused by the volume expansion of the connection metal layer 144) which may occur in the reflow process. Thus, the semiconductor light-emitting device with increased reliability may be realized.

Figure 10A:
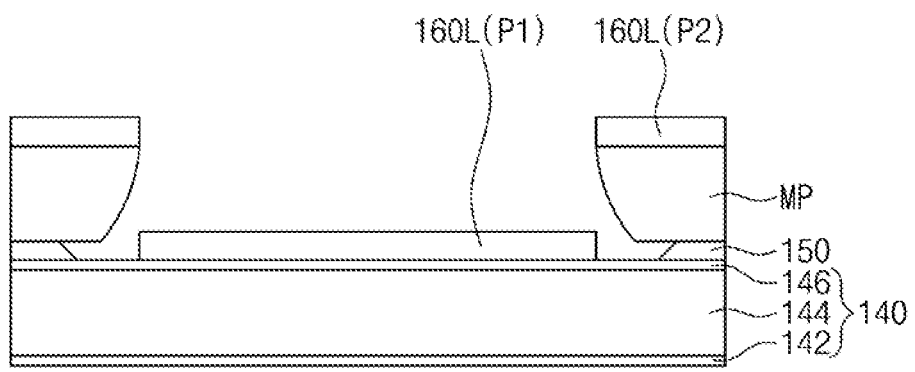
FIGS. 10A and 10B are cross-sectional views illustrating a method of forming an electrical connection part of a semiconductor light-emitting device according to an exemplary embodiment of the present inventive concept.
Figure 10B:
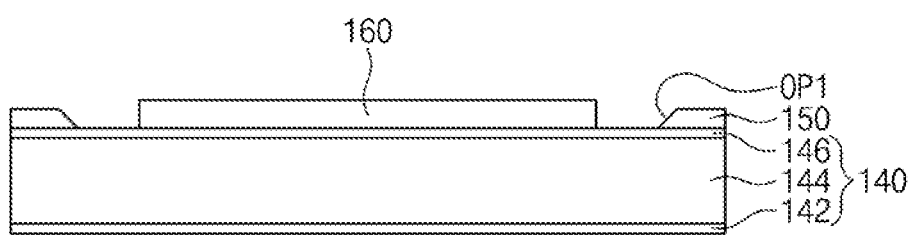

FIGS. 10A and 10B are cross-sectional views illustrating a method of forming an electrical connection part of a semiconductor light-emitting device according to an exemplary embodiment of the present inventive concept. Descriptions of the same features or components as those described above may be omitted below.

Referring to FIG. 10A, the UBM layer 160 may be formed on the connection electrode 140 on which the protective insulating layer 150 and the photoresist pattern MP are formed. The UBM layer 160L may include the first portion P1 on the connection electrode 140 and the second portion P2 on the photoresist pattern MP. In an exemplary embodiment of the present inventive concept, the UBM layer 160L may be formed by a deposition process which has lower fluidity on a deposition surface than the deposition process of the UBM layer 160L described with reference to FIG. 9D. For example, the UBM layer 160L may be formed using an e-beam deposition process. In this case, the first portion P1 of the UBM layer 160L need not be formed on the connection electrode 140 under the undercut region UC (see, e.g., FIG. 9B) and may have a sidewall substantially perpendicular to the top surface of the connection electrode 140. In addition, the second portion P2 of the UBM layer 160L may substantially cover the top surface of the photoresist pattern MP but need not cover the inner sidewall of the photoresist pattern MP exposed by the second opening OP2. In an exemplary embodiment of the present inventive concept, the UBM layer 160L may be formed using a plating process. A method of forming the connection electrode 140, the protective insulating layer 150, and the photoresist pattern MP may be substantially the same as described with reference to FIGS. 9A and 9B, and thus duplicative descriptions may be omitted.

Referring to FIG. 10B, the photoresist pattern MP may be removed. The method of removing the photoresist pattern MP may be substantially the same as described with reference to FIG. 9E. During the removal of the photoresist pattern MP, the second portion P2 of the UBM layer 160L may also be removed but the first portion Pb of the UBM layer 160L may remain so as to be formed into the UBM pattern 160.

Referring again to FIG. 6, the connection terminal 170 may be formed on the UBM pattern 160, and thus the electrical connection part 11 described with reference to FIG. 6 may be formed. A method of forming the connection terminal 170 may be substantially the same as described with reference to FIG. 5.

Figure 11A:
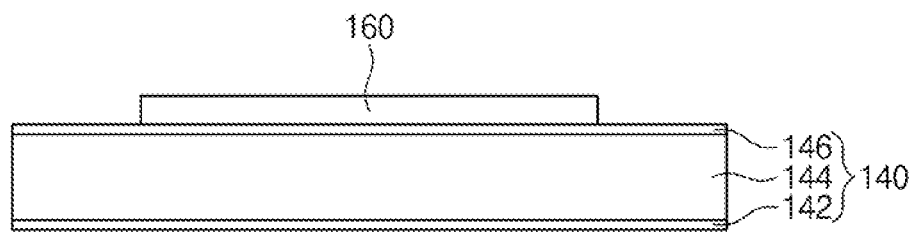
FIGS. 11A to 11C are cross-sectional views illustrating a method of forming an electrical connection part of a semiconductor light-emitting device according to an exemplary embodiment of the present inventive concept.
Figure 11B:
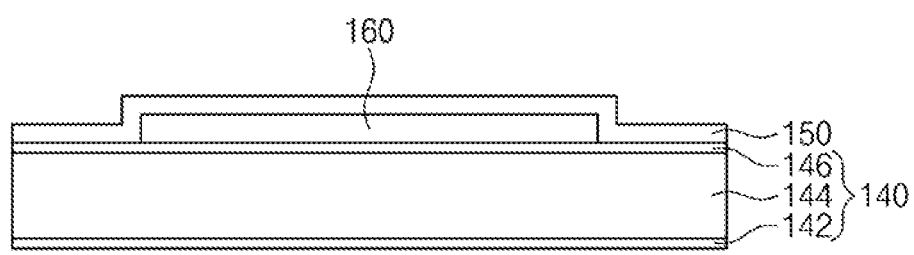
Figure 11C:
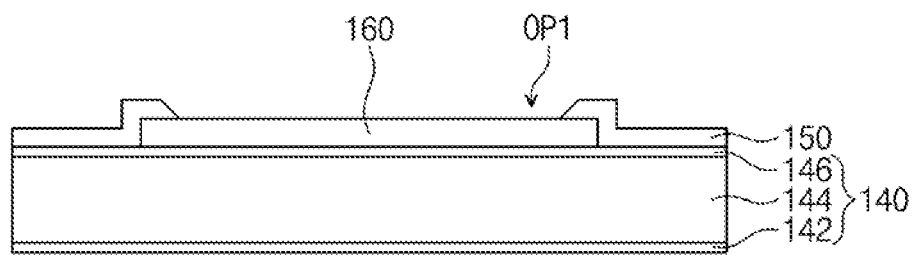

FIGS. 11A to 11C are cross-sectional views illustrating a method of forming an electrical connection part of a semiconductor light-emitting device according to an exemplary embodiment of the present inventive concept. Descriptions of the same features or components as those described above may be omitted below.

Referring to FIG. 11A, the UBM pattern 160 may be formed on the connection electrode 140. In an exemplary embodiment of the present inventive concept, the formation of the UBM pattern 160 may include forming a mask pattern on the connection electrode 140, forming a UBM layer on the connection electrode 140 on which the mask pattern is formed, and removing the mask pattern. In an exemplary embodiment of the present inventive concept, the formation of the UBM pattern 160 may include forming a UBM layer on the connection electrode 140, forming a mask pattern on the UBM layer, and etching the UBM layer using the mask pattern as an etch mask. The mask pattern may include a photoresist material, and the UBM layer may be formed using a sputtering process or an e-beam deposition process. Referring to FIG. 11A, the connection electrode 140 may include the reflective metal layer 142, the connection metal layer 144 and the barrier layer 146, which are sequentially stacked. However, exemplary embodiments of the present inventive concept are not limited thereto Referring to FIG. 11B, the protective insulating layer 150 may be formed on the connection electrode 140. The protective insulating layer 150 may substantially cover upper and side surfaces of the UBM pattern 160.

Referring to FIG. 11C, the first opening OP1 may be formed in the protective insulating layer 150. The first opening OP1 may partially expose the top surface of the UBM pattern 160. A mask pattern may be formed on the protective insulating layer 150, and the protective insulating layer 150 may be etched using the mask pattern as an etch mask to form the first opening OP1.

Referring again to FIG. 8, the solder bump 174 may be formed in the first opening OP1 of the protective insulating layer 150. For example, solder may be deposited on the UBM pattern 160, and a reflow process may be performed on the solder to form the solder bump 174. During the reflow process, the inter-metal compound 172 may be formed between the solder bump 174 and the UBM pattern 160. Thus, the electrical connection part 11 described with reference to FIG. 8 may be formed.

In an exemplary embodiment of the present inventive concept, the protective insulating layer 150 may be in contact with the UBM pattern 160, and thus it is possible to prevent the material (e.g., the metal) of the connection terminal 170 from being diffused into the connection electrode 140 during the reflow process. As a result, it is possible to prevent the defect (e.g., the crack caused by the volume expansion of the connection metal layer 144) which may occur during the reflow process.

Semiconductor light-emitting device including the electrical connection parts described above will be described in more detail below.

Figure 12:
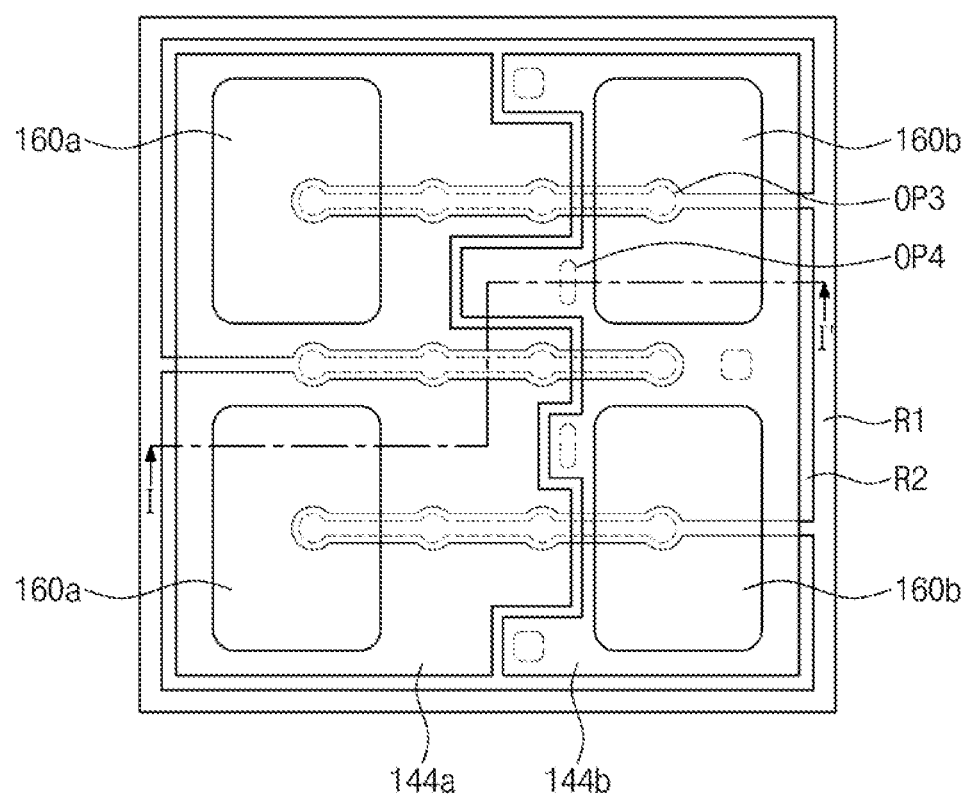
FIG. 12 is a schematic plan view illustrating a semiconductor light-emitting device according to an exemplary embodiment of the present inventive concept.
Figure 17:
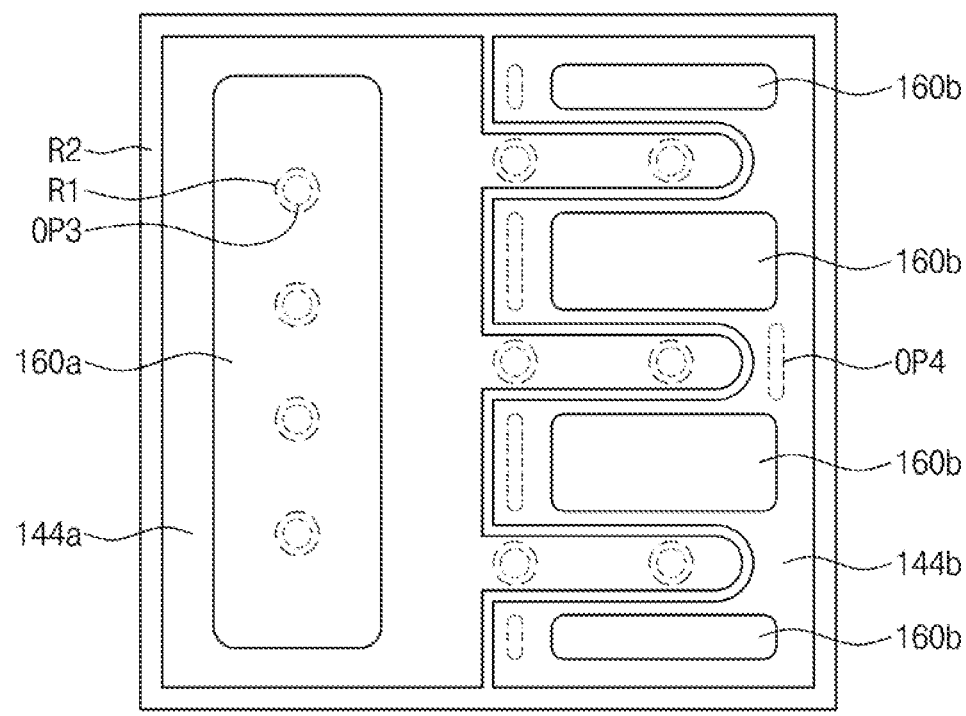
FIG. 17 is a schematic plan view illustrating a semiconductor light-emitting device according to an exemplary embodiment of the present inventive concept.

FIG. 12 is a schematic plan view illustrating a semiconductor light-emitting device according to an exemplary embodiment of the present inventive concept. FIGS. 13 to 16 are cross-sectional views taken along a line I-I' of FIG. 12. FIG. 17 is a schematic plan view illustrating a semiconductor light-emitting device according to an exemplary embodiment of the present inventive concept.

Referring to FIGS. 12 and 13, a semiconductor light-emitting device 20 may include a substrate 100, a light-emitting structure 110, insulating layers 120, 130, and 150, and electrical connection parts 11a and 11b. The light-emitting structure 110 may include a first semiconductor layer 112, an active layer 114 and a second semiconductor layer 116, which are sequentially stacked on the substrate 100. The electrical connection parts 11a and 11b may include a first electrical connection part 11a electrically connected to the first semiconductor layer 112 and a second electrical connection part 11b electrically connected to the second semiconductor layer 116. The insulating layers 120, 130, and 150 may include a first insulating layer 120, a second insulating layer 130, and the protective insulating layer 150. The substrate 100 may be, for example, a sapphire substrate and may be provided as a substrate for growing a semiconductor. A buffer layer may be disposed between the substrate 100 and the first semiconductor layer 112. The buffer layer may relax stress generated by lattice mismatch between the substrate 100 and the first semiconductor layer 112.

The light-emitting structure 110 may include a first region R1 and a second region R2. The first region R1 may correspond to an etched region of the light-emitting structure 110, in which the second semiconductor layer 116 and the active layer 114 are etched to expose a top surface of the first semiconductor layer 112. The second region R2 may correspond to a mesa region of the light-emitting structure 110, which is not etched during the formation of the first region R1. The second region R2 may be thicker than the first region R1.

The first semiconductor layer 112 may include a semiconductor material doped with N-type dopants and may be, for example, an N-type nitride semiconductor layer. The second semiconductor layer 116 may include a semiconductor material doped with P-type dopants and may be, for example, a P-type nitride semiconductor layer. The first and second semiconductor layers 112 and 116 may have a composition formula of $Al_xIn_yGa_{(1-x-y)}N$ (where $0 \leq x \leq 1$, $0 \leq y \leq 1$, and $0 \leq x+y \leq 1$) and may include, for example, GaN, AlGaN, InGaN, or AlInGaN.

The active layer 114 disposed between the first and second semiconductor layers 112 and 116 may emit light having a predetermined energy by recombination of electrons and holes. The active layer 114 may include a material of which an energy band gap is smaller than those of the first and second semiconductor layers 112 and 116. For example, when the first and second semiconductor layers 112 and 116 include a GaN-based compound semiconductor, the active layer 114 may include an InGaN-based compound semiconductor of which an energy band gap is smaller than that of the GaN-based compound semiconductor. The active layer 114 may have a multiple quantum well (MQW) structure in which quantum well layers and quantum barrier layers are alternately stacked, e.g., an InGaN/GaN structure. However, exemplary embodiments of the present inventive concept are not limited thereto. In an exemplary embodiment of the present inventive concept, the active layer 114 may have a single quantum well (SQW) structure.

The first insulating layer 120 may be disposed on the first and second regions R1 and R2 of the light-emitting structure 110. The first insulating layer 120 may partially expose a top surface of the second semiconductor layer 116 on the second region R2 and a top surface of the first semiconductor layer 112 on the first region R1. The first insulating layer 120 may include an insulating material (e.g., silicon oxide) of which a refractive index is lower than that of the second semiconductor layer 116. However, exemplary embodiments of the present inventive concept are not limited thereto.

A contact electrode 125 may be disposed on the top surface of the second semiconductor layer 116 exposed by the first insulating layer 120. As an example, the contact electrode 125 may be positioned in the second region R2 of the light-emitting structure 110 and may be in direct contact with the top surface of the second semiconductor layer 116 in the second region R2. In an exemplary embodiment of the present inventive concept, the contact electrode 125 may include Ag, Al, any combination thereof, or any alloy thereof. In an exemplary embodiment of the present inventive concept, the contact electrode 125 may include a metal or alloy including at least one of Ag, Al, Ni, Au, Ag, Ti, Cr, Pd, Cu, Pt, Sn, W, Rh, Ir, Ru, Mg, or Zn.

The second insulating layer 130 substantially covering the contact electrode 125 may be disposed on the first insulating layer 120. The second insulating layer 130 may include at least one third opening OP3 exposing the first semiconductor layer 112 in the first region R1 and at least one fourth opening OP4 exposing the contact electrode 125 in the second region R2. In an exemplary embodiment of the present inventive concept, each of the third and fourth openings OP3 and OP4 may include a plurality of opening. The second insulating layer 130 may include a same material as the first insulating layer 120. For example, the second insulating layer 130 may include silicon oxide or silicon nitride.

Connection electrodes 140a and 140b may be disposed on the second insulating layer 130. The connection electrodes 140a and 140b may include a first connection electrode 140a connected to the first semiconductor layer 112 through the third opening OP3 in the second insulating layer 130 and a second connection electrode 140b connected to the contact electrode 125 through the fourth opening OP4 in the second insulating layer 130. The first connection electrode 140a may include a first reflective metal layer 142a, a first connection metal layer 144a and a first barrier layer 146a, which are sequentially stacked. The second connection electrode 140b may include a second reflective metal layer 142b, a second connection metal layer 144b and a second barrier layer 146b, which are sequentially stacked. The first reflective metal layer 142a may be in direct contact with the second insulating layer 130 positioned thereunder and the first semiconductor layer 112 exposed through the third opening OP3. The first connection metal layer 144a may substantially cover an entire top surface of the first reflective metal layer 142a, and the first barrier layer 146a may substantially cover an entire top surface of the first connection metal layer 144a. For example, a planar shape of the first reflective metal layer 142a and/or a planar shape of the first barrier layer 146a may be substantially the same as a planar shape of the first connection metal layer 144a when viewed in a plan view. However, exemplary embodiments of the present inventive concept are not limited thereto.

The second reflective metal layer 142b may be in direct contact with the second insulating layer 130 disposed thereunder and the contact electrode 125 exposed through the fourth opening OP4. The second connection metal layer 144b may substantially cover an entire top surface of the second reflective metal layer 142b, and the second barrier layer 146b may substantially cover an entire top surface of the second connection metal layer 144b. For example, a planar shape of the second reflective metal layer 142b and/or a planar shape of the second barrier layer 146b may be substantially the same as a planar shape of the second connection metal layer 144b when viewed in a plan view. However, exemplary embodiments of the present inventive concept are not limited thereto. The reflective metal layers 142a and 142b, the connection metal layers 144a and 144b, and the barrier layers 146a and 146b may include the same materials as the reflective metal layer 142, the connection metal layer 144, and the barrier layer 146 of the electrical connection part 11 described above, respectively.

Each of the connection metal layers 144a and 144b may have a thickness of from about 500 Å to about 15,000 Å. As an example, each of the connection metal layers 144a and 144b may have a thickness of about 5,000 Å or more. In addition, a total planar area of the connection metal layers 144a and 144b may be greater than a total planar area of UBM patterns 160a and 160b when viewed in a plan view. For example, the total planar area of the connection metal layers 144a and 144b may be equal to or greater than twice the total planar area of the UBM patterns 160a and 160b. The total planar area of the connection metal layers 144a and 144b may be equal to or greater than about 80% of a total planar area of the semiconductor light-emitting device 20. Each of the barrier layers 146a and 146b may have a smaller thickness than each of the connection metal layers 144a and 144b, respectively. For example, each of the barrier layers 146a and 146b may have a thickness of from about 300 Å to about 10,000 Å.

The protective insulating layer 150 may be disposed on the first and second connection electrodes 140a and 140b. The protective insulating layer 150 may extend into the first region R1 to cover the second insulating layer 130 and may include fifth openings OP5 partially exposing the top surfaces of the first and second connection electrodes 140a and 140b on the second region R2. For example, the protective insulating layer 150 may include a silicon oxide layer and/or a silicon nitride layer, which correspond to passivation insulating layers.

UBM patterns 160a and 160b may be disposed on the top surfaces of the connection electrodes 140a and 140b exposed through the fifth openings OP5, respectively. For example, the UBM patterns 160a and 160b may include a first UBM pattern 160a disposed on the first connection electrode 140a and a second UBM pattern 160b disposed on the second connection electrode 140b. The UBM patterns 160a and 160b may be the same or similar as the UBM pattern 160 of the electrical connection part 11 described above in more detail. For example, the UBM patterns 160a and 160b may have a single-layered or multi-layered structure and may include at least one of Ni, Cu, Cr, Au, $NiO_x$, $CrO_x$, Ti, $TiO_x$, Sn, $SnO_x$, or TiW. The number of each of the first and second UBM patterns 160a and 160b described with reference to FIG. 12 is two. However, exemplary embodiments of the present inventive concept are not limited thereto. In an exemplary embodiment of the present inventive concept, the number of each of the first and second UBM patterns 160a and 160b may be one or may be three or more.

A first connection terminal 170a may be disposed on the first UBM pattern 160a, and a second connection terminal 170b may be disposed on the second UBM pattern 160b. The first and second connection terminals 170a and 170b may be the same as or similar to the connection terminal 170 of the electrical connection part 11 described above in more detail. For example, each of the first and second connection terminals 170a and 170b may include the inter-metal compound and the solder bump, like the connection terminal 170 of the electrical connection part 11.

The first connection electrode 140a, the first UBM pattern 160a, and the first connection terminal 170a may be included in the first electrical connection part 11a. The second connection electrode 140b, the second UBM pattern 160b, and the second connection terminal 170b may be included in the second electrical connection part 11b. In an exemplary embodiment of the present inventive concept, referring to FIG. 14, the barrier layers 146a and 146b may be omitted in the connection electrodes 140a and 140b. In an exemplary embodiment of the present inventive concept, referring to FIG. 15, the reflective metal layers 142a and 142b may be omitted in the connection electrodes 140a and 140b. In this case, an additional contact electrode 127 may be disposed in the third opening OP3 of the second insulating layer 130 and may be in contact with the first semiconductor layer 112. The additional contact electrode 127 may include a same material as the contact electrode 125. The first connection metal layer 144a may be electrically connected to the first semiconductor layer 112 through the additional contact electrode 127. In an exemplary embodiment of the present inventive concept, referring to FIG. 16, the protective insulating layer 150 may be in contact with the UBM patterns 160a and 160b, and the connection terminals 170a and 170b on the UBM patterns 160a and 160b need not be in contact with the connection electrodes 140a and 140b.

The planar arrangements and the numbers of the components described above may be variously modified, as desired. For example, referring to FIG. 17, each of first regions R1 of the light-emitting structure 110 may be formed in an island shape, and each of third openings OP3 of the second insulating layer 130 may be formed in an island shape in each of the first regions R1. As an example, one first UBM pattern 160a may be provided but four second UBM patterns 160b may be provided (see, e.g., FIG. 17).

A semiconductor light-emitting device package including the semiconductor light-emitting device described above will be described below in more detail.

Figure 18:
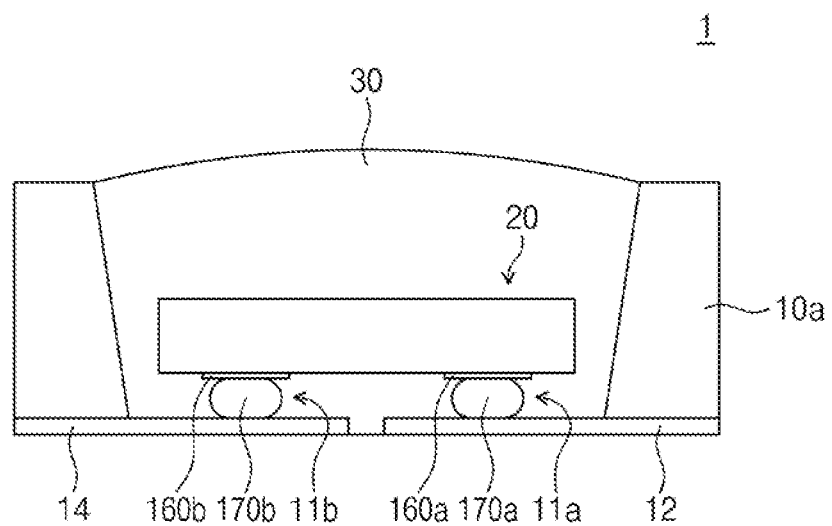
FIGS. 18 and 19 are each schematic cross-sectional views illustrating semiconductor light-emitting device packages according to an exemplary embodiment of the present inventive concept.
Figure 19:
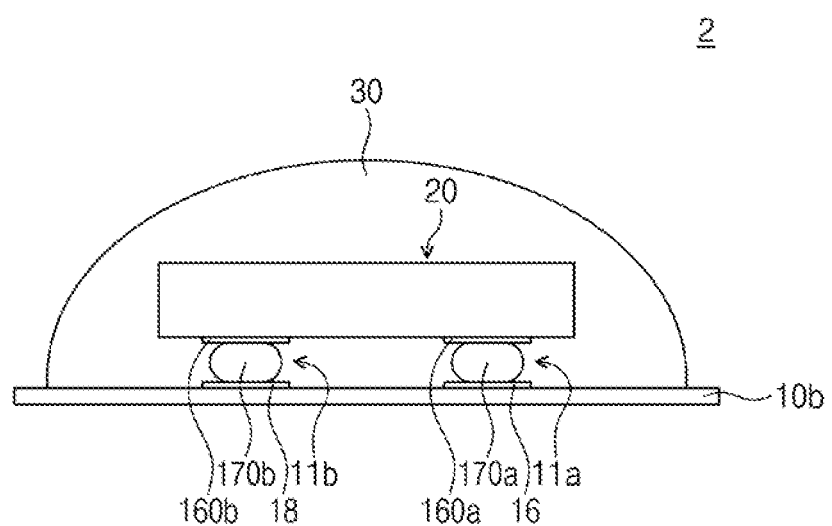

FIGS. 18 and 19 are each schematic cross-sectional views illustrating semiconductor light-emitting device packages according to an exemplary embodiment of the present inventive concept.

Referring to FIG. 18, a semiconductor light-emitting device package 1 according to an exemplary embodiment of the present inventive concept may include a package body 10a, at least two lead frames 12 and 14, the semiconductor light-emitting device 20, and a sealing layer 30. The lead frames 12 and 14 may include a first lead frame 12 and a second lead frame 14. The semiconductor light-emitting device 20 may be the same as one of the semiconductor light-emitting devices described with reference to FIGS. 12 to 17, and thus duplicative descriptions may be omitted below.

The semiconductor light-emitting device 20 may be positioned above the first and second lead frames 12 and 14. The semiconductor light-emitting device 20 may be positioned above the connection terminals 170a and 170b, and may be disposed on the UBM patterns 160a and 160b. AS an example, the first UBM pattern 160a may be electrically connected to the first lead frame 12 through the first connection terminal 170a, and the second UBM pattern 160b may be electrically connected to the second lead frame 14 through the second connection terminal 170b. The first UBM pattern 160a and the first connection terminal 170a may be included in the first electrical connection part 11a, and the second UBM pattern 160b and the second connection terminal 170b may be included in the second electrical connection part 11b. Each of the first and second electrical connection parts 11a and 11b may include a single or multiple electrical connection parts.

The package body 10a may include a reflective cup for increasing reflection efficiency and light extraction efficiency of light, and the sealing layer 30 formed of a transparent material may be disposed in the reflective cup to seal the semiconductor light-emitting device 20. The sealing layer 30 may include a resin in which a fluorescent substance is dispersed. The fluorescent substance may include, for example, a green fluorescent substance and/or a red fluorescent substance.

Electrical signals applied to the lead frames 12 and 14 may be transmitted to the active layer 114 (see, e.g., FIG. 13) through the electrical connection parts 11a and 11b, and thus electrons and holes may be recombined with each other in the active layer 114. Light generated by the electron-hole recombination may be emitted upward through the substrate 100 of FIG. 13. As an example, the semiconductor light-emitting device 20 may have a flip-chip structure in which the light is emitted through the substrate 100.

Referring to FIG. 19, a semiconductor light-emitting device package 2 may include a mounting substrate 10b, the semiconductor light-emitting device 20, and the sealing layer 30. The semiconductor light-emitting device 20 may be the same as one of the semiconductor light-emitting devices described with reference to FIGS. 12 to 17, and thus duplicative descriptions may be omitted below.

The semiconductor light-emitting device 20 may be positioned above the mounting substrate 10b and may be electrically connected to first and second circuit patterns 16 and 18. For example, the first UBM pattern 160a may be electrically connected to the first circuit pattern 16 through the first connection terminal 170a, and the second UBM pattern 160b may be electrically connected to the second circuit pattern 18 through the second connection terminal 170b. For example, the mounting substrate 10b may be a printed circuit board (PCB), a metal core PCB (MCPCB), a multi-layered PCB (MPCB), or a flexible PCB (FPCB). The semiconductor light-emitting device 20 may be sealed by the sealing layer 30. Thus, a chip-on-board (COB)-type package structure may be realized. The structure of package including the semiconductor light-emitting device 20 according to an exemplary embodiment of the present inventive concept is not limited to the above embodiments but may be in other various forms (e.g., a chip-scale package form), as desired.

According to an exemplary embodiment of the present inventive concept, the connection electrode electrically connected to the semiconductor layer of the semiconductor light-emitting device may include the connection metal layer including the metal material having the relatively low reactivity with the solder material of the connection terminal and/or may include the barrier layer preventing the diffusion of the solder material. Thus, it is possible to prevent a crack from occurring in the connection metal layer and/or other layers adjacent to the connection metal layer in the process of forming the connection terminal. Thus, the semiconductor light-emitting device with increased reliability may be realized.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:

1. A semiconductor light-emitting device comprising:
   a light-emitting structure including a first semiconductor layer, an active layer and a second semiconductor layer sequentially stacked;
   a connection electrode positioned above the light-emitting structure, the connection electrode comprising a connection metal layer electrically connected to at least one of the first and second semiconductor layers;
   a UBM pattern on the connection electrode;
   a connection terminal on the UBM pattern,
   wherein the connection metal layer includes a first metal element, wherein a heat conductivity of the first metal element is higher than that of gold (Au),
   wherein the connection terminal includes a second metal element,
   wherein a first reactivity of the first metal element with the second metal element is lower than a second reactivity of gold (Au) with the second metal element, and
   wherein the connection terminal is in contact with an upper surface of the connection electrode; and
   a protective insulating layer disposed on the connection electrode and spaced apart from the UBM pattern along the upper surface of the connection electrode,
   wherein the connection terminal is spaced apart from the protective insulating layer along the upper surface of the connection electrode.

2. The semiconductor light-emitting device of claim 1, wherein the first metal element includes copper (Cu), and wherein the second metal element includes tin (Sn).

3. The semiconductor light-emitting device of claim 1, wherein the connection electrode further comprises a barrier layer between the connection metal layer and the UBM pattern, and
   wherein the barrier layer extends along the upper surface of the connection electrode and is in contact with the protective insulating layer.

4. The semiconductor light-emitting device of claim 3, wherein the barrier layer includes at least one of Cr, Ti, Pt, or TiW.

5. The semiconductor light-emitting device of claim 3, wherein the barrier layer comprises a first barrier layer and a second barrier layer sequentially stacked, and
   wherein the first and second barrier layers include metal materials different from each other.

6. The semiconductor light-emitting device of claim 3, wherein a thickness of the barrier layer is smaller than a thickness of the connection metal layer.

7. The semiconductor light-emitting device of claim 1, wherein the connection electrode further comprises a reflective metal layer between the light-emitting structure and the connection metal layer, and
   wherein the reflective metal layer is connected to one of the first and second semiconductor layers.

8. The semiconductor light-emitting device of claim 1, further comprising:
   a first insulating layer between the light-emitting structure and the connection electrode,
   wherein the light-emitting structure includes a first region and a second region having a greater thickness than the first region,
   wherein the first insulating layer covers a portion of the light-emitting structure in the second region along a direction orthogonal to an upper surface of the light-emitting structure, and
   wherein the first insulating layer includes an opening exposing the second semiconductor layer in the second region.

9. The semiconductor light-emitting device of claim 8, wherein the connection electrode is connected to the second semiconductor layer through the opening.

10. The semiconductor light-emitting device of claim 9, wherein the connection electrode is a first connection electrode, the semiconductor light-emitting device further comprising:
    a second connection electrode positioned above the first insulating layer in the first region, the second connection electrode spaced apart from the first connection electrode, and the second connection electrode comprising a second connection metal layer including a same material as the connection metal layer; and
    a contact electrode positioned in the first region, wherein the contact electrode is in contact with the first semiconductor layer in the first region,
    wherein the second connection electrode is positioned in an opening formed in the first insulating layer in the first region, and wherein the second connection electrode is in contact with the contact electrode.

11. A semiconductor light-emitting device comprising:
    a light-emitting structure including a first semiconductor layer, an active layer and a second semiconductor layer sequentially stacked;
    a connection electrode on the light-emitting structure;
    a UBM pattern on the connection electrode;
    a protective insulating layer disposed on the connection electrode and spaced apart from the UBM pattern along an upper surface of the connection electrode; and
    a connection terminal disposed on the UBM pattern, wherein the connection terminal is in contact with an upper surface of the connection electrode,
    wherein the connection electrode comprises:
    a connection metal layer electrically connected to at least one of the first and second semiconductor layers;
    a barrier layer disposed between the connection metal layer and the UBM pattern and between the UBM pattern and the protective insulating layer; and
    a protective insulating layer disposed on the connection electrode and spaced apart from the UBM pattern along the upper surface of the connection electrode,
    wherein the connection terminal is spaced apart from the protective insulating layer along the upper surface of the connection electrode.

12. The semiconductor light-emitting device of claim 11, wherein the connection metal layer includes a first metal element of which a heat conductivity is higher than that of gold (Au),
    wherein the connection terminal includes a second metal element, and wherein a first reactivity of the first metal element with the second metal element is lower than a second reactivity of gold (Au) with the second metal element.

13. A semiconductor light-emitting device comprising:
a light emitting structure comprising a first semiconductor layer, an active layer disposed on the first semiconductor layer and a second semiconductor layer disposed on the active layer;
a contact electrode disposed on the second semiconductor layer;
an insulating layer formed on the second semiconductor layer and the contact electrode, wherein the insulating layer comprises a hole exposing the contact electrode;
a connection electrode disposed on the insulating layer, wherein the connection electrode is in direct contact with the contact electrode in the hole, and wherein the connection electrode comprises a first metal element including copper (Cu) and a second metal element including tin (Sn);
a UBM pattern disposed on the connection electrode; and
a connection terminal disposed on the UBM pattern, wherein the connection terminal is in direct contact with the connection electrode.

14. The semiconductor light-emitting device of claim 13, further comprising a protective insulating layer positioned on the connection electrode and spaced apart from the connection terminal.

15. The semiconductor light-emitting device of claim 13, wherein the connection electrode comprises a reflective metal layer, a connection metal layer and a barrier layer.

16. The semiconductor light-emitting device of claim 15, wherein the reflective metal layer is disposed between the insulating layer and the connection metal layer, and wherein the barrier layer is disposed between the connection metal layer and the UBM pattern.

17. The semiconductor light-emitting device of claim 16, wherein the reflective metal layer is positioned in the hole between the connection metal layer and the contact electrode.

18. The semiconductor light-emitting device of claim 1, wherein the connection terminal substantially covers upper and side surfaces of the UBM pattern.

19. The semiconductor light-emitting device of claim 1, wherein the connection terminal has a wider width than a width of the UBM pattern.

* * * * *